United States Patent
Otomo

(10) Patent No.: US 12,476,158 B2
(45) Date of Patent: Nov. 18, 2025

(54) SEMICONDUCTOR MODULE AND MANUFACTURING METHOD OF SEMICONDUCTOR MODULE

(71) Applicant: FUJI ELECTRIC CO., LTD., Kanagawa (JP)

(72) Inventor: Yoshinori Otomo, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 460 days.

(21) Appl. No.: 17/581,963

(22) Filed: Jan. 23, 2022

(65) Prior Publication Data

US 2022/0293481 A1 Sep. 15, 2022

(30) Foreign Application Priority Data

Mar. 11, 2021 (JP) .................. 2021-039477

(51) Int. Cl.
*H01L 23/31* (2006.01)
*H01L 21/48* (2006.01)
(Continued)

(52) U.S. Cl.
CPC ...... *H01L 23/3121* (2013.01); *H01L 21/4807* (2013.01); *H01L 21/565* (2013.01);
(Continued)

(58) Field of Classification Search
CPC ... H01L 21/56; H01L 21/4807; H01L 21/565; H01L 23/3107; H01L 23/49531;
(Continued)

(56) References Cited

U.S. PATENT DOCUMENTS

| 5,698,899 A | * | 12/1997 | Hirakawa | ............. H01L 21/565 |
| | | | | 257/796 |
| 2005/0040530 A1 | * | 2/2005 | Shi | ......................... H01L 23/08 |
| | | | | 257/E23.125 |

(Continued)

FOREIGN PATENT DOCUMENTS

| EP | 0418891 A2 | 3/1991 |
| JP | S5977241 U | 5/1984 |

(Continued)

OTHER PUBLICATIONS

Office Action issued for counterpart Japanese Application No. 2021-039477, transmitted from the Japanese Patent Office on Oct. 22, 2024.

(Continued)

*Primary Examiner* — Teresa M. Arroyo

(57) ABSTRACT

Provided is a semiconductor module, including: a semiconductor chip; a terminal, configured to extend in a extending direction, and be connected electrically with the semiconductor chip; a sealing resin, configured to seal the semiconductor chip, and cover at least a part of an upper surface of the terminal and at least a part of a lower surface of the terminal; and a lower side resin, configured to extend in the extending direction from the sealing resin, and cover at least a part of the lower surface of the terminal, wherein in the extending direction, a length at which the sealing resin and the lower side resin cover the lower surface of the terminal is greater than a length at which the sealing resin covers the upper surface of the terminal in the extending direction; and wherein the sealing resin and the lower side resin are formed of a same material.

20 Claims, 17 Drawing Sheets

(51) Int. Cl.
    *H01L 21/56* (2006.01)
    *H01L 23/00* (2006.01)
    *H01L 23/373* (2006.01)

(52) U.S. Cl.
    CPC .......... *H01L 23/3735* (2013.01); *H01L 24/32* (2013.01); *H01L 24/40* (2013.01); *H01L 24/48* (2013.01); *H01L 24/73* (2013.01); *H01L 2224/32225* (2013.01); *H01L 2224/40175* (2013.01); *H01L 2224/48175* (2013.01); *H01L 2224/73221* (2013.01); *H01L 2224/73263* (2013.01); *H01L 2224/73265* (2013.01); *H01L 2924/1815* (2013.01)

(58) Field of Classification Search
    CPC . H01L 23/36; H01L 23/4334; H01L 23/3121; H01L 23/3735; H01L 24/29; H01L 24/83; H01L 24/32; H01L 24/40; H01L 24/48; H01L 24/73; H01L 2224/40225; H01L 2224/48091; H01L 2224/48247; H01L 2224/83801; H01L 2224/29101; H01L 2224/32225; H01L 2224/40175; H01L 2224/48175; H01L 2224/73221; H01L 2224/73263; H01L 2224/73265; H01L 2924/00014; H01L 2924/13055; H01L 2924/181; H01L 2924/1815; H01L 2924/00012; H01L 2924/00; H01L 2224/45099; H01L 2924/014; H01L 2224/37099
    USPC .......................................................... 257/790
    See application file for complete search history.

(56) References Cited

U.S. PATENT DOCUMENTS

| | | |
|---|---|---|
| 2007/0205503 A1 | 9/2007 | Baek |
| 2014/0138803 A1* | 5/2014 | Otremba ................. H01L 23/34 257/676 |
| 2015/0255367 A1* | 9/2015 | Nakahara ............ H01L 23/4006 438/122 |
| 2019/0057928 A1* | 2/2019 | Kawashima ............ H01L 23/42 |
| 2020/0266121 A1* | 8/2020 | Fuergut ............ H01L 23/49568 |
| 2020/0395278 A1* | 12/2020 | Harada ................... H01L 25/18 |
| 2021/0313495 A1* | 10/2021 | Musashi ................. H01L 33/54 |
| 2021/0327777 A1* | 10/2021 | Iwai ...................... H01L 23/367 |

FOREIGN PATENT DOCUMENTS

| | | | | |
|---|---|---|---|---|
| JP | 62232945 A | * | 10/1987 | .......... H01L 23/293 |
| JP | S63131141 U | | 8/1988 | |
| JP | 63314856 A | * | 12/1988 | |
| JP | H03108744 A | | 5/1991 | |
| JP | H0730008 A | | 1/1995 | |
| JP | H11243173 A | | 9/1999 | |
| JP | 2015115382 A | | 6/2015 | |
| JP | 2019192739 A | | 10/2019 | |
| JP | 2020053611 A | | 4/2020 | |

OTHER PUBLICATIONS

Office Action issued for counterpart Japanese Application No. 2021-039477, transmitted from the Japanese Patent Office on Jan. 7, 2025 (drafted on Dec. 24, 2024).

* cited by examiner

SEMICONDUCTOR MODULE AND MANUFACTURING METHOD OF SEMICONDUCTOR MODULE

The contents of the following Japanese patent application are incorporated herein by reference:
NO. 2021-039477 filed in JP on Mar. 11, 2021.

BACKGROUND

1. Technical Field

The present invention relates to a semiconductor module, and a manufacturing method of the semiconductor module.

2. Related Art

Conventionally, a semiconductor module including a semiconductor chip mounted on a circuit board and a terminal, connected electrically with the semiconductor chip, for outputting a current to the outside or inputting a current from the outside is known (for example, refer to Patent Document 1 to 3).
Patent Document 1: No. H11-243173
Patent Document 2: No. H07-30008
Patent Document 3: No. S63-131141

DESCRIPTION OF EXEMPLARY EMBODIMENTS

Hereinafter, (some) embodiment(s) of the present invention will be described. the embodiment(s) do(es) not limit the invention according to the claims. And all the combinations of the features described in the embodiment(s) are not necessarily essential to means provided by aspects of the invention. It should be noted that in this specification and the drawings, elements having substantially the same functions and configurations are marked with the same sign to omit redundant explanations, and elements not directly related to the present invention are omitted from the figures. In a single drawing, elements with the same function and configuration may be marked with a representative symbol, and others may be omitted.

Herein, one side in the direction parallel to the depth direction of the semiconductor chip is referred to as the "upper" and the other side as the "lower". One surface of two main surfaces of a substrate, a layer or other members is referred to as an upper surface, and the other surface is referred to as a lower surface. The "upper" and "lower" directions are not limited to the direction of gravity or the direction of the semiconductor module when it is mounted.

In the present specification, technical matters may be described using orthogonal coordinate axes of an X axis, a Y axis, and a Z axis. The orthogonal coordinate axes merely identify relative positions of the components, and do not limit a specific direction. For example, the Z axis does not limit the height direction with respect to the ground. It should be noted that a +Z axis direction and a −Z axis direction are opposite to each other. When the Z axis direction is described without describing the sign, it means that the direction is parallel to the +Z axis and the −Z axis. In the present specification, the orthogonal axes parallel to the upper surface and lower surface of the semiconductor chip are the X axis and Y axis. In addition, the axis perpendicular to the upper surface and the lower surface of the semiconductor substrate is referred to as the Z axis. In the present specification, the direction of the Z axis may be referred to as the depth direction. In addition, in the present specification, the direction parallel to the upper surface and the lower surface of the semiconductor substrate, including the X axis and the Y axis, may be referred to as a horizontal direction.

In the present specification, when referred to as "same" or "equal", it may include a case where there is an error due to manufacturing variation or the like. The corresponding error is within, for example, 10%.

Figure 1A:
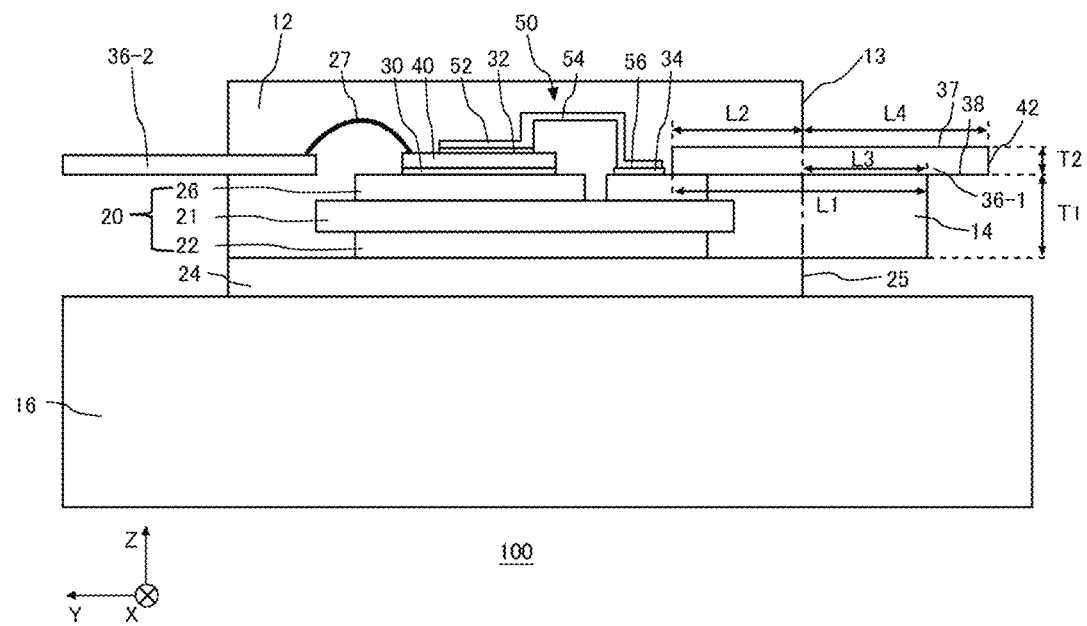
FIG. 1 illustrates one example of a semiconductor module 100 according to one embodiment of the present invention.
FIG. 1b illustrates the one example of the semiconductor module 100 as shown in FIG. 1 with lower side resin 14 covering the outer edge 42 of the terminal.
Figure 1B:
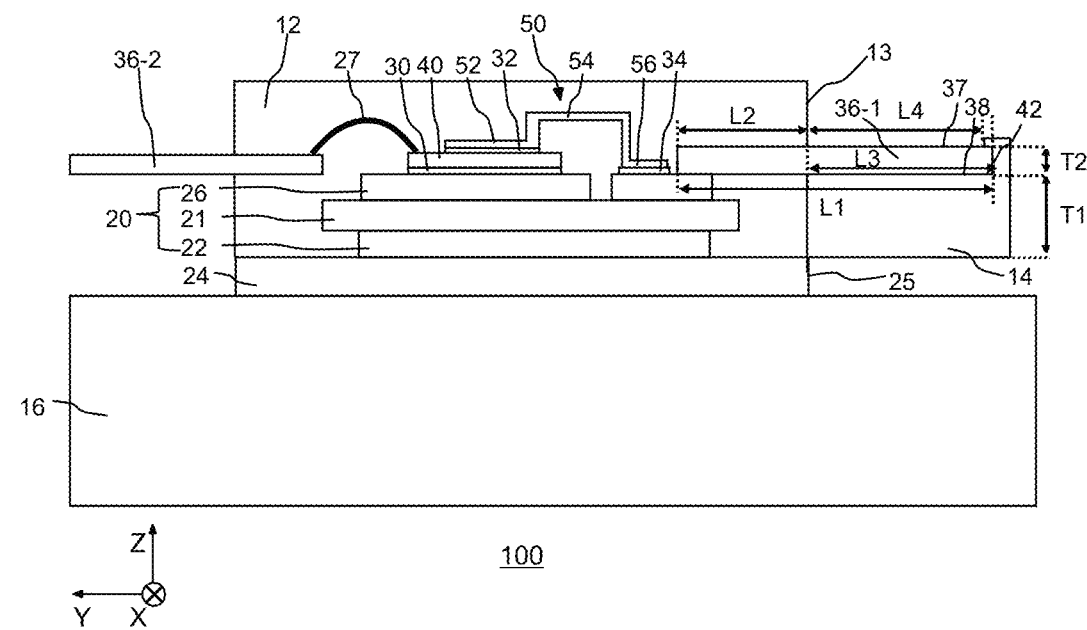

FIG. 1 illustrates one example of a semiconductor module 100 according to one embodiment of the present invention. The semiconductor module 100 may function as a power conversion apparatus such as an inverter. The semiconductor module 100 includes one or more circuit boards 20. Herein, the orthogonal axes in the plane where one or more circuit boards 20 are provided are the X axis and Y axis, and the axis perpendicular to the XY plane is the Z axis. In FIG. 1, an arrangement example of each member in YZ plane is shown. The circuit board 20 is provided with a predetermined circuit pattern 26 on either one surface of the insulating substrate 21, and a heat releasing board 22 on the other surface. The circuit pattern 26 and the heat releasing board 22 may be constructed by bonding a copper or aluminum plate, or a plate plated with these materials, directly bonded to an insulating substrate 21 such as silicon nitride ceramics or aluminum nitride ceramics, or through a brazing layer. It should be noted that the circuit board 20 may be made by laminating an insulating sheet to a conductive member such as a copper or aluminum plate. In other words, it may be a board-shaped member in which the conductive member and the insulating member are integrated.

On the circuit board 20, one or more semiconductor chips 40 are mounted. In the example of FIG. 1, one semiconductor chip 40 is mounted. A bonding portion 30 bonds the semiconductor chip 40 to the circuit pattern 26 of the circuit board 20. The bonding portion 30 is solder or the like. The semiconductor chip 40 or the like is protected by a sealing resin 12. In the present example, the semiconductor chip 40 or the like is protected by a sealing resin 12 formed by transfer molding. The sealing resin 12 is in contact with the semiconductor chip 40. When formed by the transfer molding, the shape of the sealing resin 12 is fixed by using a mold. The sealing resin 12 of the present example is not housed in a resin case. That is, a side surface of the sealing resin 12 is not covered by another resin.

The semiconductor chip 40 may include an insulated gate bipolar transistor (IGBT), a diode such as a free wheel diode (FWD), a reverse conducting (RC)-IGBT and combinations thereof, and a MOS transistor and so on.

The semiconductor chip 40 of the present example is a vertical chip with electrodes (for example, emitter and collector electrodes) formed on the upper surface and the lower surface. The semiconductor chip 40 is connected with the circuit pattern 26 of the circuit board 20 by the electrode formed on the lower surface, and connected to the wiring member by the electrode formed on the upper surface. It should be noted that the semiconductor chip 40 is not limited to a vertical chip. The semiconductor chip 40 may have an electrode connected with the circuit pattern 26 on the upper surface.

The heat releasing board 22 may cover at least a part or the entire of the lower surface of the insulating substrate 21. The cooling portion 16 may be directly or indirectly connected to the circuit board 20. In the present example, the cooling portion 16 may cover at least a part or the entire of the lower surface of the heat releasing board 22. The cooling portion 16 may be provided below the circuit board 20. The bonding portion 24 bonds the heat releasing board 22 of the circuit board 20 to the cooling portion 16. The bonding portion 24 is solder or the like. The cooling portion 16 includes a refrigerant such as water or gas inside. The cooling portion 16 cools the semiconductor chip 40 via the heat releasing board 22 or the like.

The semiconductor chip 40 has the upper surface connected to the wiring member via the bonding portion 32 of solder or the like. The wiring member of the present example is a lead frame 50 and a wire 27. The lead frame 50 is a member formed of a metal material such as copper or aluminum. The lead frame 50 may have at least a part of its surface plated by nickel or other material. The lead frame 50 may have at least a part of its surface coated with resin or other material. The lead frame 50 may have a board-shaped part. Board-shaped refers to a shape in which the area of the two main surfaces arranged facing each other is greater than the area of the other surface. In the lead frame 50, at least the part connected to the semiconductor chip 40 may be board-shaped. The lead frame 50 may be formed by bending a single metal plate.

The lead frame 50 is connected to the semiconductor chip 40 and the circuit pattern 26. A main current may flow through the lead frame 50. Herein, the main current is a maximum current among the currents that flow through the semiconductor chip 40. The lead frame 50 of the present example includes a chip connection portion 52, a bridging portion 54 and a circuit pattern connection portion 56. The chip connection portion 52 is the part bonded to the upper surface of the semiconductor chip 40. The chip connection portion 52 is bonded to the upper surface of the semiconductor chip 40 via the bonding portion 32 of solder or the like. The circuit pattern connection portion 56 is the part connected to the upper surface of the circuit pattern 26. The circuit pattern connection portion 56 is bonded to the upper surface of the circuit pattern 26 via the bonding portion 34 of solder or the like. The chip connection portion 52 and the circuit pattern connection portion 56 may be a board-shaped part approximately parallel to the XY plane. It should be noted that being approximately parallel refers to a state with an angle of, for example, 10 degree or less.

The bridging portion 54 connects the chip connection portion 52 and the circuit pattern connection portion 56. The bridging portion 54 is arranged away from the conductive member of the circuit pattern 26 or the like. The bridging portion 54 of the present example is arranged above the circuit pattern 26 or the like, and is provided from the chip connection portion 52 to the circuit pattern connection portion 56 so as to cross over the circuit pattern 26 or the like.

The wire 27 connects the semiconductor chip 40 and the terminal 36-2. The wire 27 may be connected to the gate terminal of the semiconductor chip 40. A voltage for controlling the gate of the semiconductor chip 40 may be applied to the wire 27.

The semiconductor module 100 may include a plurality of terminals 36. In the present example, the semiconductor module 100 includes a terminal 36-1 and a terminal 36-2. The terminal 36 is a member formed of a metal material of copper or aluminum, similar to the lead frame 50. The terminals 36 may have at least a part of their surface plated with nickel or other material. The terminals 36 may have at least a part of their surface coated with resin or other material. The terminal 36-1 and the terminal 36-2 are electrically connected to the semiconductor chip 40. In the present example, the terminal 36 is electrically connected to the electrode formed on the upper surface of the semiconductor chip 40 via the lead frame 50 and the circuit pattern 26. Accordingly, a main current may flow through the terminal 36-1. The terminal 36-1 may be connected to the wiring or the like of the outside, and output the main current to the outside. In the present example, the terminal 36-2 is electrically connected to the gate terminal of the semiconductor chip 40 via the wire 27. That is, the gate of the semiconductor chip 40 may be controlled by controlling the current flowing through the terminal 36-2. The terminal 36-2 may be connected with the wiring or the like of the outside, to which a current may be input from the outside. The terminal 36-1 extends in an extending direction (the Y axis direction in the present example). The terminal 36-2 extends in the extending direction (the Y axis direction in the present example).

In the present example, the sealing resin 12 seals the semiconductor chip 40, and the lead frame 50 and the wire 27, which function as wiring members. That is, the sealing resin 12 covers the entire of the semiconductor chip 40 and the wiring members so that the semiconductor chip 40 and the wiring members are not exposed. The semiconductor chip 40 and the wiring members can be protected by the sealing resin 12. The sealing resin 12 may contain epoxy resin. The sealing resin 12 may contain silicone gel. The sealing resin 12 may be not limited to the epoxy resin or the silicone gel. The sealing resin 12 may contain ceramic fillers. It should be noted that the sealing resin 12 seals at least a part of the terminal 36-1. The sealing resin 12 seals at least a part of the terminal 36-2. The sealing resin 12 covers at least a part of the upper surface 37 of the terminal 36 and at least a part of the lower surface 38 of the terminal 36. In the present example, the lower surface 38 of the terminal 36 is the surface facing the cooling portion 16, among the surfaces of the terminal 36. The lower surface 38 of the terminal 36 may be a surface facing the conductive member (the cooling portion 16 of the present example) on the outer side of the sealing resin 12, among the surfaces of the terminal 36. In the present example, the terminal 36-1 and the terminal 36-2 are exposed from the sealing resin 12. Each terminal 36 extends from the side surface 13 of the sealing resin 12 toward the Y axis direction.

Since the terminal 36-1 is exposed from the sealing resin 12, deformation (including tilting and deflection) of the terminal 36-1 when bonding the circuit board 20 and the cooling portion 16 may make it impossible to secure the insulation distance between the cooling portion 16 and the terminal 36-1. If the insulation distance between the cooling portion 16 and the terminal 36-1 can not be secured, it may cause failure of the semiconductor module 100.

In the present example, the semiconductor module 100 includes a lower side resin 14. In FIG. 1, the boundary between the sealing resin 12 and the lower side resin 14 is illustrated with a chain line. The boundary between the sealing resin 12 and the lower side resin 14 may match the side surface 25 of the bonding portion 24. The lower side resin 14 covers at least a part of the lower surface 38 of the terminal 36-1. Since the semiconductor module 100 includes the lower side resin 14 that covers at least a part of the lower surface 38 of the terminal 36-1, the insufficient insulation distance between the cooling portion 16 and the terminal 36-1 caused by the deformation of the terminal 36-1 can be prevented. Accordingly, the failure of the semiconductor module 100 can be prevented. In addition, the insulation distance between the cooling portion 16 and the terminal 36-1 can be secured without having to arrange a wide interval between the cooling portion 16 and the terminal 36-1, and the semiconductor module 100 can be miniaturized. The edge 42 of the terminal 36-1 may be covered by the lower side resin 14, or may be not. In the present example, the edge 42 of the terminal 36-1 is not covered by the lower side resin 14.

The sealing resin 12 and the lower side resin 14 are formed of the same material. In the present example, the sealing resin 12 and the lower side resin 14 are both formed of epoxy resin. By forming the sealing resin 12 and the lower side resin 14 with the same material, the connection between the sealing resin 12 and the lower side resin 14 can be strengthened. The sealing resin 12 and the lower side resin 14 may be formed integrally. The sealing resin 12 and the lower side resin 14 can be formed integrally by transfer molding. The sealing resin 12 and the lower side resin 14 are formed integrally, which may mean that there is no seam between the sealing resin 12 and the lower side resin 14. Since the lower side resin 14 is epoxy resin as an example, the terminals 36-1 and the lower side resin 14 may be bonded together.

The lower side resin 14 extends in the extending direction from the sealing resin 12 (the Y axis direction in the present example). In the present example, the length L1 at which the lower surface 38 of the terminal 36-1 is covered by the sealing resin 12 and the lower side resin 14 in the extending direction is greater than the length L2 at which the upper surface 37 of the terminal 36-1 is covered by the sealing resin 12 in the extending direction. In this example, the length L1 at which the lower surface 38 of the terminal 36-1 is covered by the sealing resin 12 and the lower side resin 14 in the extending direction includes the portion where the lower surface 38 of the terminal 36-1 connects with the circuit pattern 26. By configuring the lower side resin 14 in this way, the insufficient insulation distance between the cooling portion 16 and the terminal 36-1 caused by the deformation of the terminal 36-1 can be prevented.

The length L3 at which the lower surface 38 of the terminal 36-1 is covered by the lower side resin 14 in the extending direction may be 30% or more of the length L4 at which the lower surface 38 of the terminal 36-1 is not covered by the sealing resin 12 in the extending direction. The length L4 where the lower surface 38 of the terminal 36-1 is not covered by the sealing resin 12 in the extending direction may be the length where the upper surface 37 of the terminal 36-1 is not covered by the sealing resin 12 in the extending direction. By making the length L3 be 30% or more of the length L4, it becomes easier to inhibit the deformation of the terminal 36-1. The length L3 may be 40% or more of the length L4. The length L3 may be 50% or more of the length L4.

The lower side resin 14 is arranged between the terminal 36-1 and the cooling portion 16. By placing the lower side resin 14 between the terminal 36-1 and the cooling portion 16, the insulation distance between the cooling portion 16 and the terminal 36-1 can be secured. In the present example, the lower side resin 14 is arranged away from the cooling portion 16.

The thickness T1 in the height direction of the lower side resin 14 is greater than the thickness T2 in the height direction of the terminal 36-1. In other words, the thickness T1 of the lower side resin in the height direction is the same as the distance between the terminal 36-1 and the bonding portion 24 in the height direction. The distance in the height direction between the terminal 36-1 and the bonding portion 24 may be the shortest distance in the height direction between the lower surface 38 of the terminal 36-1 and the upper surface of the bonding portion 24. By making the thickness T1 in the height direction of the lower side resin 14 larger than the thickness T2 in the height direction of the terminal 36-1, it is easier to further inhibit the deformation of the terminal 36-1. The thickness T1 in the height direction of the lower side resin 14 may be twice or more than the thickness T2 in the height direction of the terminal 36-1. The thickness T1 in the height direction of the lower side resin 14 may be three times or more than the thickness T2 in the height direction of the terminal 36-1. In this example, the thickness T2 of the lower side resin 14 in the height direction is constant. A constant thickness may be assumed to be constant even if there is an error of 10% or less.

Figure 2:
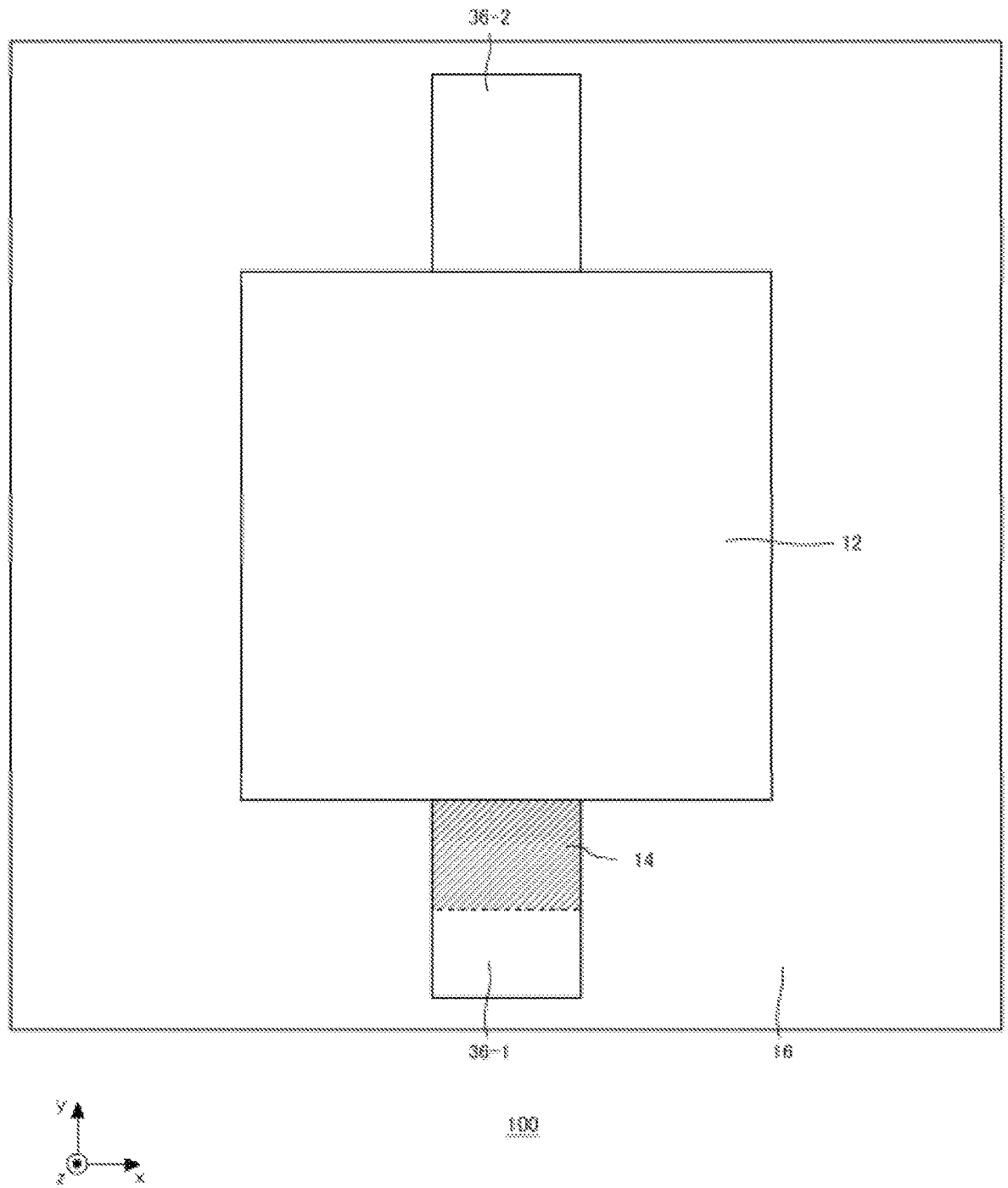
FIG. 2 illustrates one example of the semiconductor module 100 in a top view.

FIG. 2 illustrates one example of the semiconductor module 100 in a top view. In the top view, the semiconductor module 100 includes a sealing resin 12, a cooling portion 16, a terminal 36-1 and a terminal 36-2. It should be noted that in FIG. 2, the range where the lower side resin 14 is provided is illustrated by hatching. In the present example, as terminals 36, the semiconductor module 100 has only the terminal 36-1 and the terminal 36-2, but the semiconductor module 100 may have three or more terminals 36.

In the present example, the lower side resin 14 is provided in a range where the terminal 36-1 is provided. The lower side resin 14 is only provided on the lower surface 38 of the terminal 36-1. Since the lower side resin 14 is only provided on the lower surface 38 of the terminal 36-1, the amount of the sealing resin 12 can be reduced, and the manufacturing cost can be reduced. It should be noted that the lower side resin 14 may be provided in a range where the terminal 36-2 is provided, similar to the terminal 36-1. The lower side resin 14 may be provided in a range where a part of the terminal 36-1 is provided, or in a range where both of the terminals 36-1 and 36-2 are provided. If the lower side resin 14 is provided only in a range where a part of the terminal 36-1 is provided, the width of the part of the terminal 36-1 may be thicker in the X axis direction or thicker in the Z axis direction than the other terminal 36-2. The part of the terminal 36-1 may be a main terminal through which the main current flows.

Figure 3:
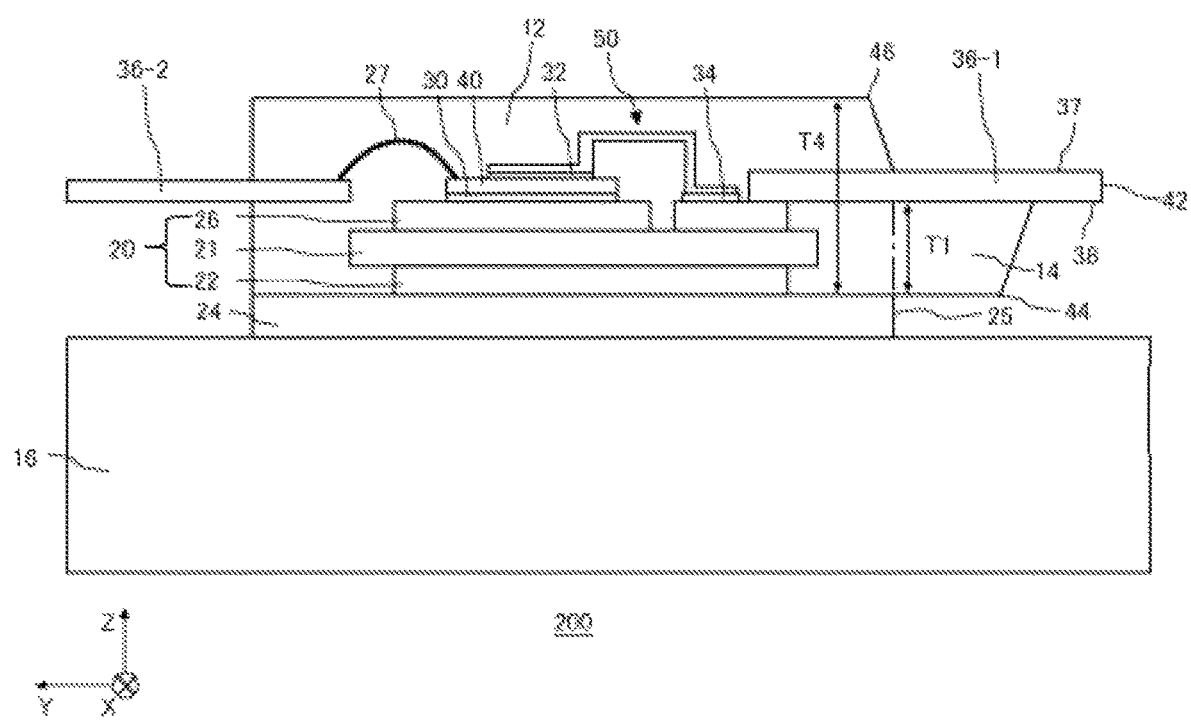
FIG. 3 illustrates one example of a semiconductor module 200 according to one embodiment of the present invention.

FIG. 3 illustrates one example of the semiconductor module 200 according to one embodiment of the present invention. The semiconductor module 200 of FIG. 3 is different from the semiconductor module 100 of FIG. 1 in the shapes of the sealing resin 12 and the lower side resin 14. The other configurations of the semiconductor module 200 may be the identical to the semiconductor module 100.

In the present example, the thickness T1 in the height direction of the lower side resin 14 decreases as it approaches the edge 42 of the terminal 36-1 from the sealing resin 12. In FIG. 3, the thickness T1 of the lower side resin 14 in the height direction is constant from the sealing resin 12 to point 44, and decreases linearly from point 44. This configuration makes it easier to remove the mold when the lower side resin 14 is formed by transfer molding. Therefore, the lower side resin 14 can be formed easily.

In the present example, the thickness T4 in the height direction of the sealing resin 12 decreases as it approaches the edge 42 of the terminal 36-1 from the sealing resin 12. In FIG. 3, the thickness T4 in the height direction of the sealing resin 12 decreases linearly from the point 46. With this configuration, the sealing resin 12 can be formed easily when formed by transfer molding.

Figure 4:
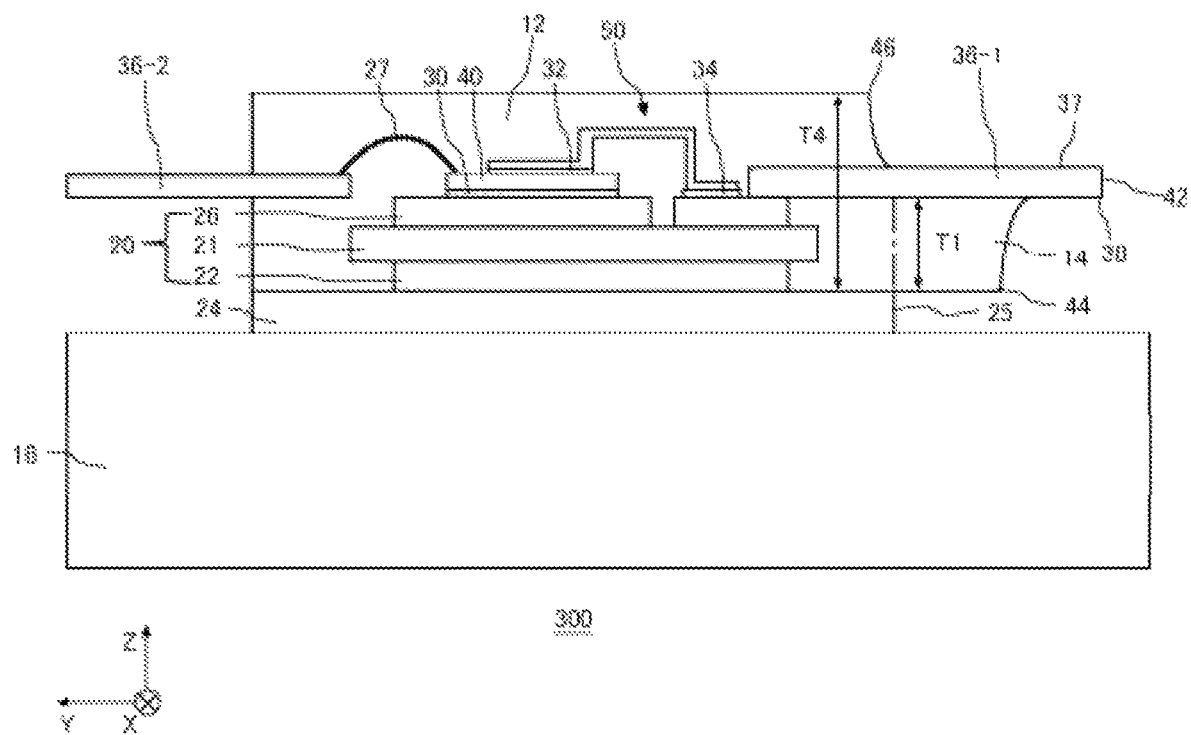
FIG. 4 illustrates one example of a semiconductor module 300 according to one embodiment of the present invention.

FIG. 4 illustrates one example of the semiconductor module 300 according to one embodiment of the present invention. The semiconductor module 300 of FIG. 4 is different from the semiconductor module 100 of FIG. 1 in the shapes of the sealing resin 12 and the lower side resin 14. The other configurations of the semiconductor module 300 may be the identical to the semiconductor module 100.

In the present example, the thickness T1 in the height direction of the lower side resin 14 decreases as it approaches the edge 42 of the terminal 36-1 from the sealing resin 12, similar to FIG. 3. In FIG. 4, the thickness T1 of the lower side resin 14 in the height direction is constant from the sealing resin 12 to point 44, and decreases from point 44. In FIG. 4, the shape of the lower side resin 14 has a tail along the lower surface 38 of the terminal 36-1. In other words, the shape of the lower side resin 14 is convex to the lower surface 38 of the terminal 36-1. Even with this configuration, the lower side resin 14 can be easily formed when formed by transfer molding.

In the present example, the thickness T4 in the height direction of the sealing resin 12 decreases as it approaches the edge 42 of the terminal 36-1 from the sealing resin 12. In FIG. 4, the thickness T4 in the height direction of the sealing resin 12 decreases from the point 46. In FIG. 4, the shape of the sealing resin 12 has a tail along the upper surface 37 of the terminals 36. In other words, the shape of the sealing resin 12 is convex to the upper surface 37 of the terminal 36-1. Even with this configuration, the sealing resin 12 can be easily formed when formed by transfer molding.

Figure 5:
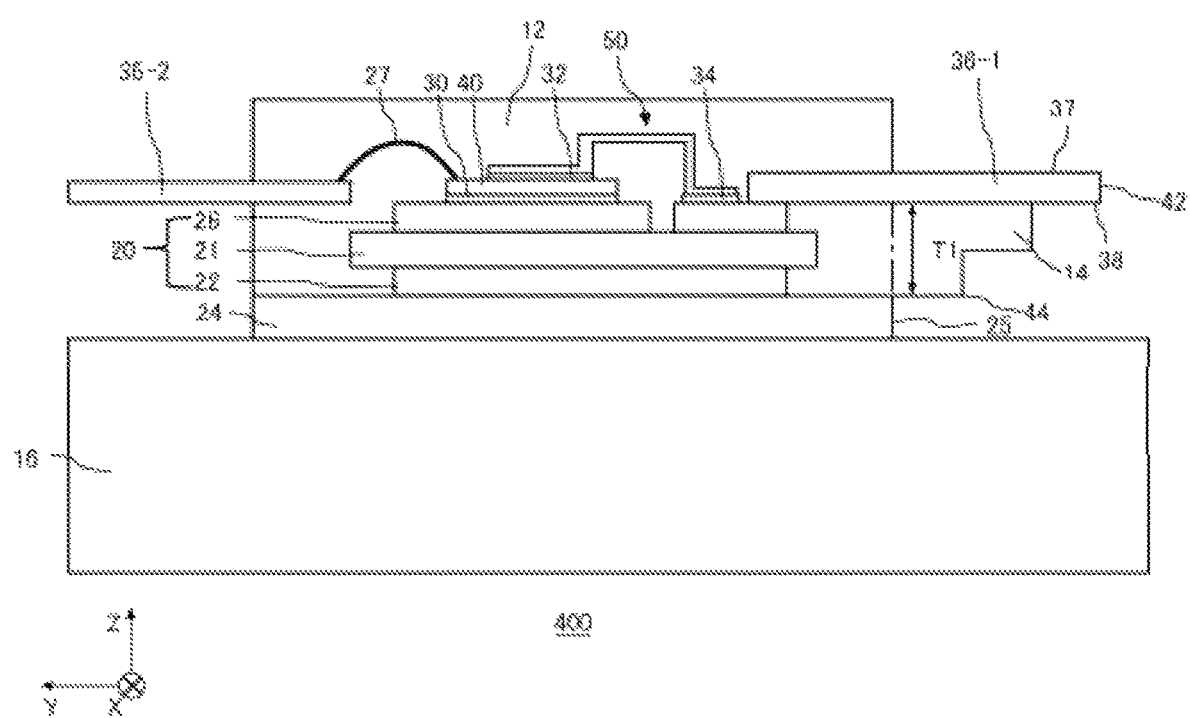
FIG. 5 illustrates one example of a semiconductor module 400 according to one embodiment of the present invention.

FIG. 5 illustrates one example of the semiconductor module 400 according to one embodiment of the present invention. The semiconductor module 400 of FIG. 5 is different from the semiconductor module 100 of FIG. 1 in the shape of the lower side resin 14. The other configurations of the semiconductor module 400 may be the identical to the semiconductor module 100.

In the present example, the thickness T1 in the height direction of the lower side resin 14 decreases as it approaches the edge 42 of the terminal 36-1 from the sealing resin 12, similar to FIG. 3 and FIG. 4. In FIG. 5, the thickness T1 of the lower side resin 14 in the height direction is constant from the sealing resin 12 to point 44, and changes in a stepwise manner from point 44. Even with this configuration, the lower side resin 14 can be easily formed when formed by transfer molding.

Figure 6:
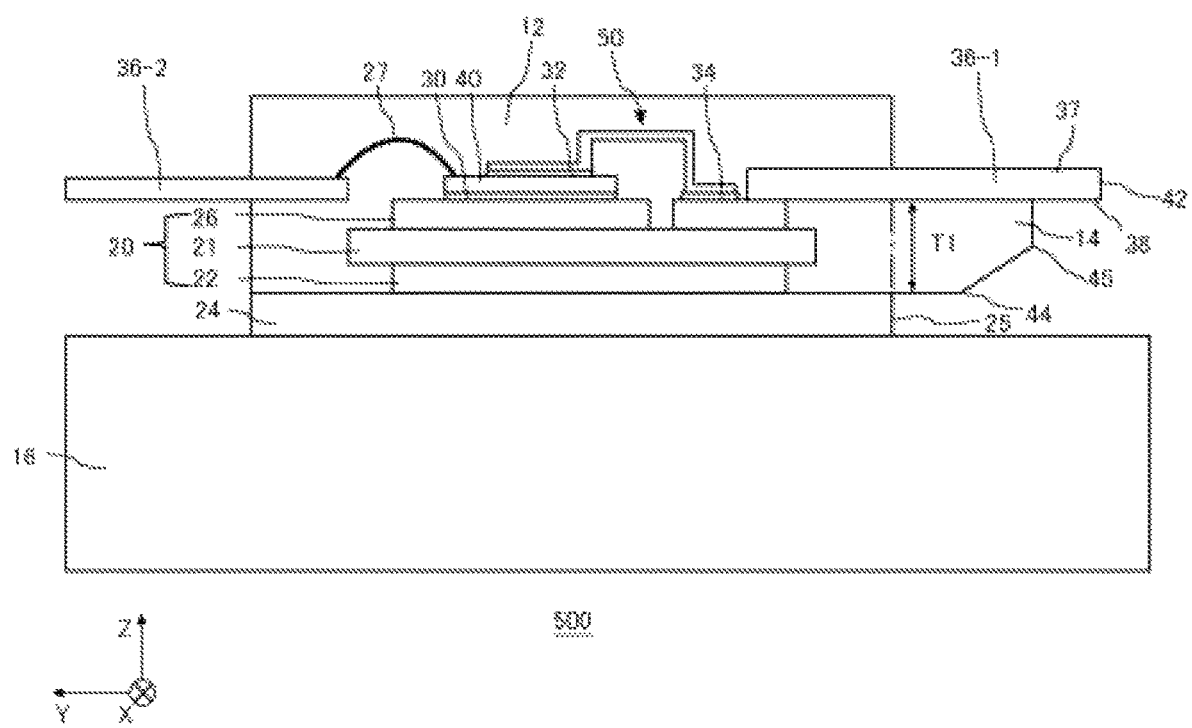
FIG. 6 illustrates one example of a semiconductor module 500 according to one embodiments of the present invention.

FIG. 6 illustrates one example of the semiconductor module 500 according to one embodiment of the present invention. The semiconductor module 500 of FIG. 6 is different from the semiconductor module 100 of FIG. 1 in the shape of the lower side resin 14. The other configurations of the semiconductor module 500 may be the identical to the semiconductor module 100.

In the present example, the thickness T1 in the height direction of the lower side resin 14 decreases as it approaches the edge 42 of the terminal 36-1 from the sealing resin 12, similar to FIG. 3, FIG. 4 and FIG. 5. In FIG. 6, the thickness T1 of the lower side resin 14 in the height direction is constant from the sealing resin 12 to point 44, changes with an inclination from point 44 to point 45, and changes parallel to the height direction from point 45. Even with this configuration, the lower side resin 14 can be easily formed when formed by transfer molding.

Figure 7:
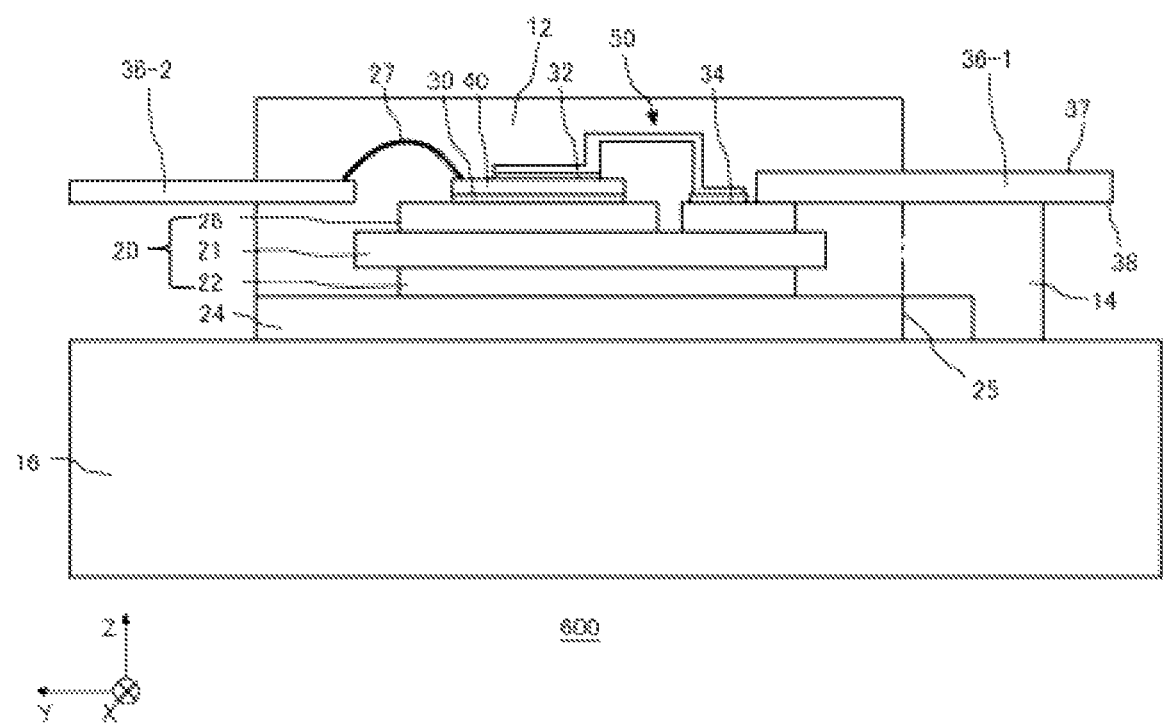
FIG. 7 illustrates one example of a semiconductor module 600 according to one embodiment of the present invention.

FIG. 7 illustrates one example of the semiconductor module 600 according to one embodiment of the present invention. The semiconductor module 600 of FIG. 7 is different from the semiconductor module 100 of FIG. 1 in the shape of the lower side resin 14. The other configurations of the semiconductor module 600 may be the identical to the semiconductor module 100.

In the present example, the lower side resin 14 is arranged in contact with the cooling portion 16. That is, the lower surface of the lower side resin 14 is in contact with the upper surface of the cooling portion 16. Since the lower side resin 14 is arranged in contact with the cooling portion 16, it is easier to further inhibit the deformation of the terminals 36-1.

The lower side resin 14 may be arranged away from the side surface 25 of the bonding portion 24. If the lower side resin 14 and the side surface 25 of the bonding portion 24 are in contact with each other, it may affect the heating conditions of the bonding portion 24 and other factors, resulting in bonding defect. Therefore, by arranging the lower side resin 14 away from the side surface 25 of the bonding portion 24, bonding defects can be reduced.

Figure 8:
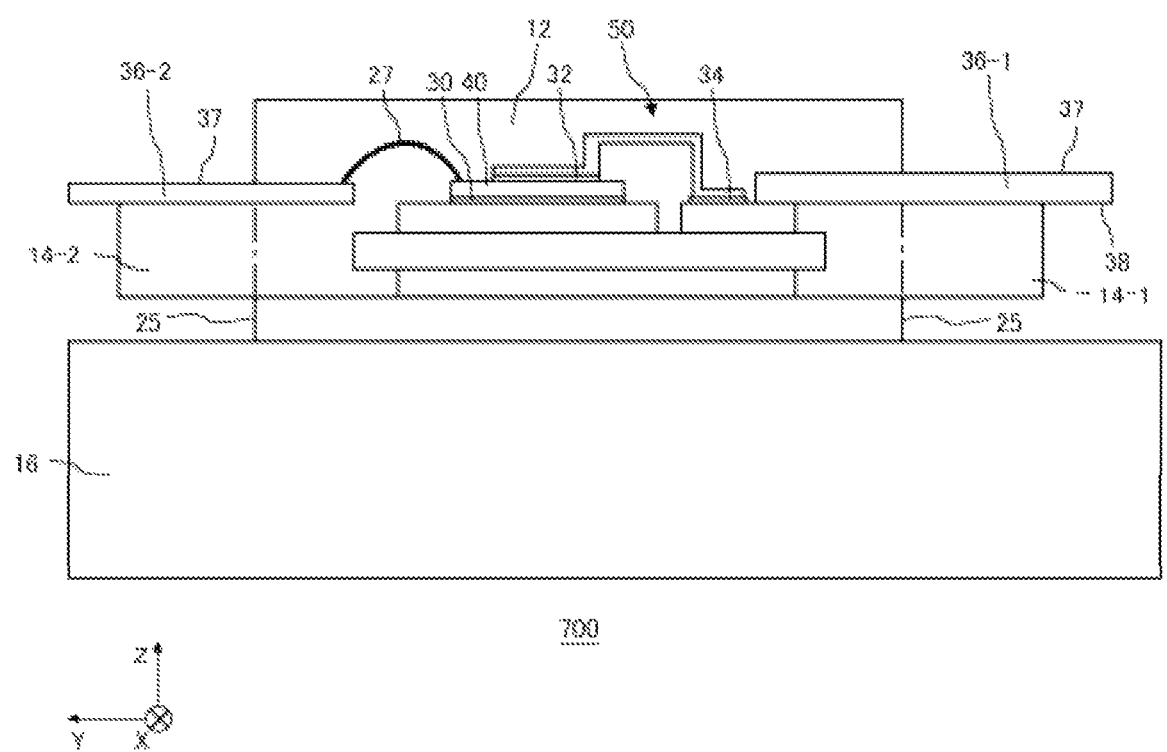
FIG. 8 illustrates one example of a semiconductor module 700 according to one embodiments of the present invention.

FIG. 8 illustrates one example of the semiconductor module 700 according to one embodiment of the present invention. The semiconductor module 700 of the FIG. 8 is different from the semiconductor module 100 of the FIG. 1 in the point of including a lower side resin 14-2 on the lower surface 38 of the terminal 36-2. The other configurations of the semiconductor module 700 may be the identical to the semiconductor module 100. The lower side resin 14 provided on the lower surface 38 of the terminal 36-1 functions as the lower side resin 14-1. It should be noted that in FIG. 8, the boundary between the sealing resin 12 and the lower side resin 14-2 is illustrated by a chain line. The boundary between the sealing resin 12 and the lower side resin 14-2 may match the side surface 25 of the bonding portion 24.

In the present example, a lower side resin 14 is provided on the lower surface 38 of each of the plurality of terminals 36. In FIG. 8, the lower side resin 14-1 is provided on the lower surface 38 of the terminal 36-1, and the lower side resin 14-2 is provided on the lower surface 38 of the terminal 36-2. This configuration can secure not only the insulation distance between the cooling portion 16 and the terminal 36-1, but also the insulation distance between the cooling portion 16 and the terminal 36-2. The lower side resin 14-2 may have a shape of the lower side resin 14 as shown in FIG. 3 to FIG. 7.

Figure 9:
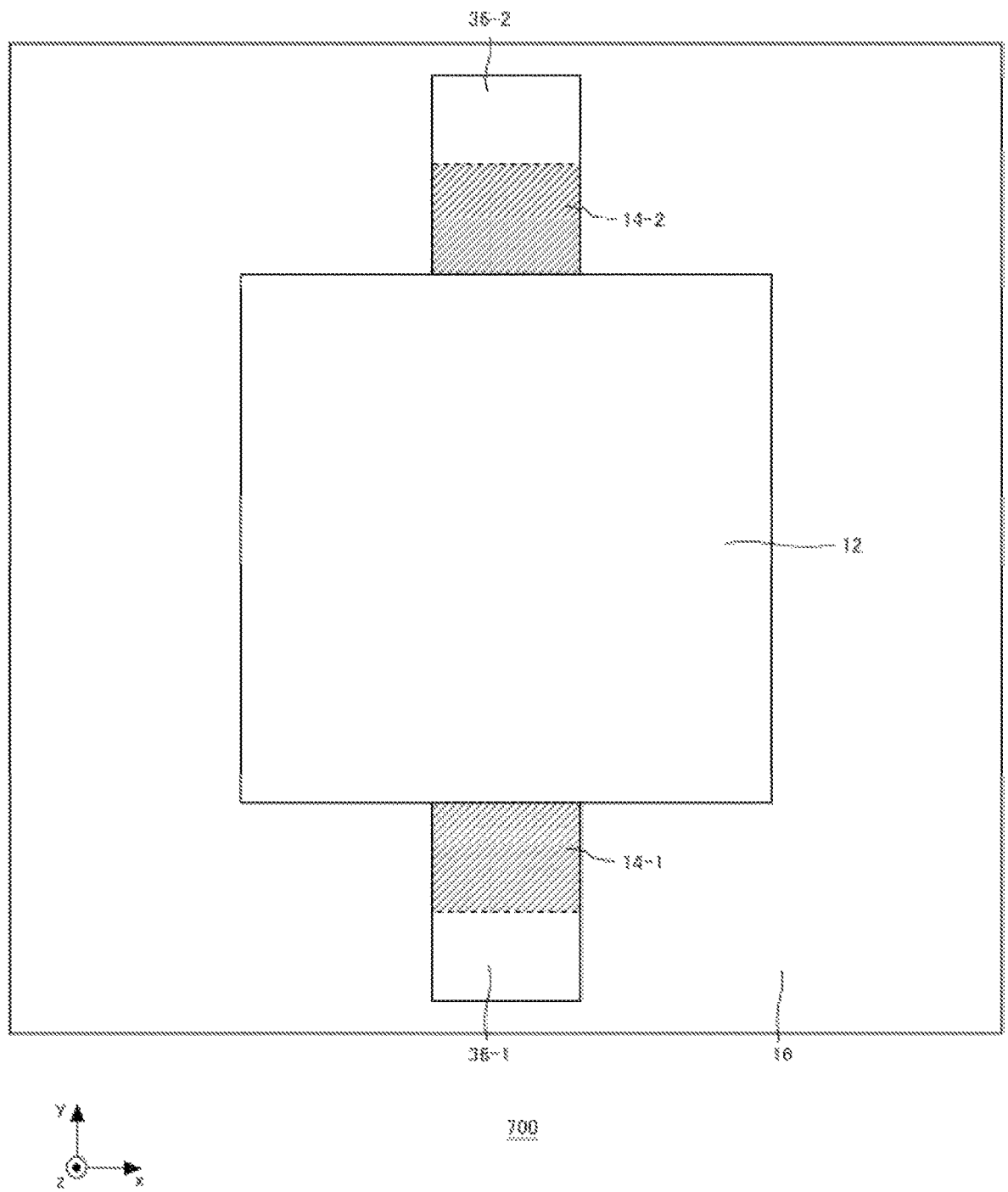
FIG. 9 illustrates one example of the semiconductor module 700 in a top view.

FIG. 9 illustrates one example of the semiconductor module 700 in a top view. In the top view, the semiconductor module 700 includes a sealing resin 12, a cooling portion 16, a terminal 36-1 and a terminal 36-2. It should be noted that in FIG. 9, the range where the lower side resin 14 is provided is illustrated by hatching. In the present example, as terminals 36, the semiconductor module 700 has only the terminal 36-1 and the terminal 36-2, but the semiconductor module 100 may have three or more terminals 36.

In the present example, the lower side resin 14 is provided in a range where the terminal 36-1 or the terminal 36-2 is provided. The lower side resin 14 is provided only on the lower surface 38 of the terminal 36-1 or the terminal 36-2. Since the lower side resin 14 is only provided on the lower surface 38 of the terminal 36-1 or the terminal 36-2, the amount of the sealing resin 12 can be reduced, and the manufacturing cost can be reduced.

Figure 10:
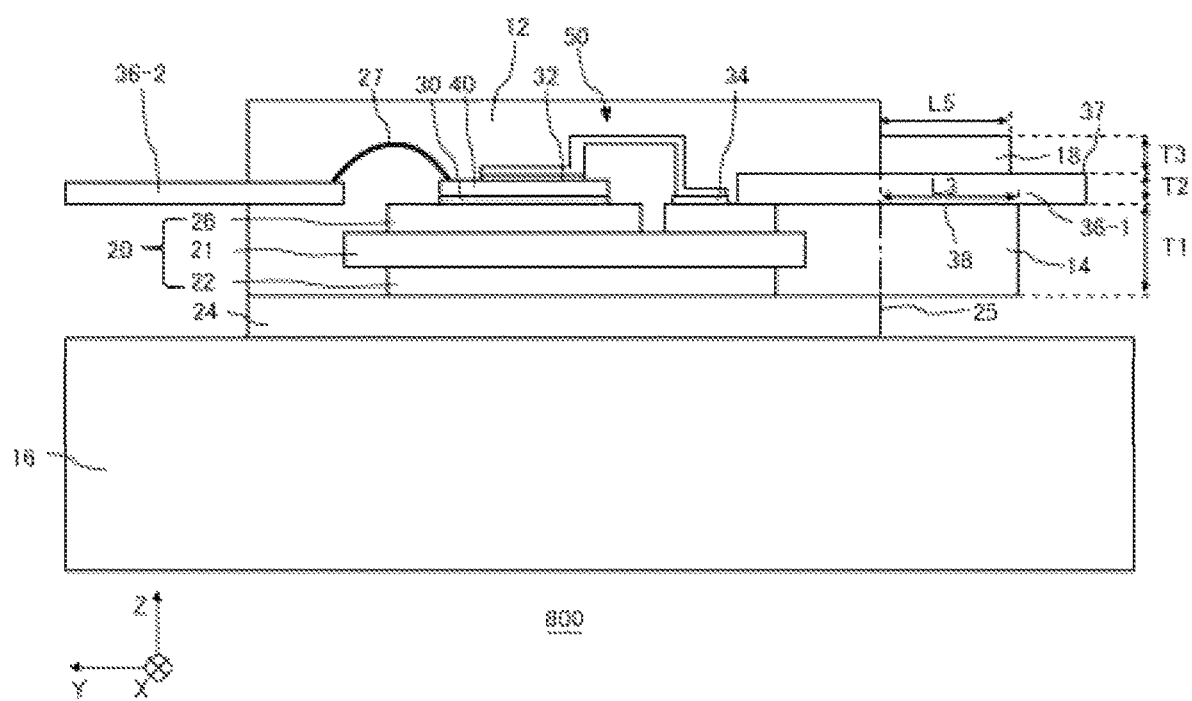
FIG. 10 illustrates one example of a semiconductor module 800 according to one embodiment of the present invention.

FIG. 10 illustrates one example of the semiconductor module 800 according to one embodiment of the present invention. The semiconductor module 800 in FIG. 10 differs from the semiconductor module 100 in FIG. 1 in that it has a coating resin 18 on the upper surface 37 of the terminal 36-1. The other configurations of the semiconductor module 800 may be the identical to the semiconductor module 100.

In the present example, the coating resin 18 covers at least a part of the upper surface 37 of the terminal 36-1. The coating resin 18, similar to the lower side resin 14, extends in the extending direction from the sealing resin 12 (the Y axis direction in the present example). The upper surface 37 of the terminal 36-1 can be protected because of including the coating resin 18. The coating resin 18 may be formed of the same material as the sealing resin 12. In other words, the coating resin 18 may be integrally formed with the sealing resin 12 and the lower side resin 14 by transfer molding.

The thickness T3 in the height direction of the coating resin 18 may be less than the thickness T1 in the height direction of the lower side resin 14. By making the thickness T3 in the height direction of the coating resin 18 less than the thickness T1 in the height direction of the lower side resin 14, the semiconductor module 100 can be miniaturized. The thickness T3 in the height direction of the coating resin 18 may be greater than the thickness T2 in the height direction of the terminal 36-1. The length L5 at which the upper surface 37 of the terminal 36-1 is covered by the coating resin 18 in the extending direction may be less than the length L3 at which the lower surface 38 of the terminal 36-1 is not covered by the lower side resin 14 in the extending direction.

Figure 11:
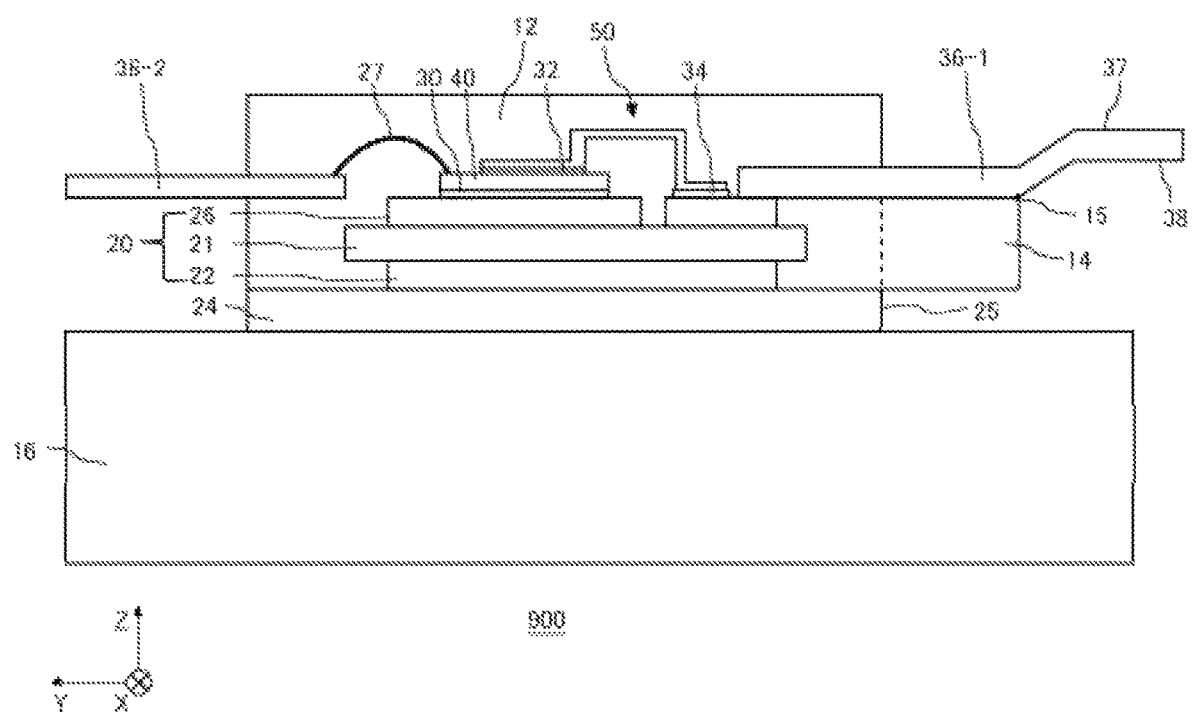
FIG. 11 illustrates one example of a semiconductor module 900 according to one embodiment of the present invention.

FIG. 11 illustrates one example of the semiconductor module 900 according to one embodiment of the present invention. The semiconductor module 900 of FIG. 11 is different from the semiconductor module 100 of FIG. 1 in the configuration of the terminal 36-1. The other configurations of the semiconductor module 900 may be the identical to the semiconductor module 100.

In the present example, the terminal 36-1 bends at the bend point 15. The bend point 15 is a point provided in the terminal 36-1. In FIG. 11, the terminal 36-1 bends upward in the height direction at the bend point 15. The lower side resin 14 is provided under the bend point 15. By providing the lower side resin 14 under the bend point 15, the terminal 36-1 tends to bend easilier due to the support by the lower side resin 14. Since the terminal 36-1 bends in the height direction at the bend point 15, external wires tend to be connected to the terminal 36-1 easilier.

Figure 12:
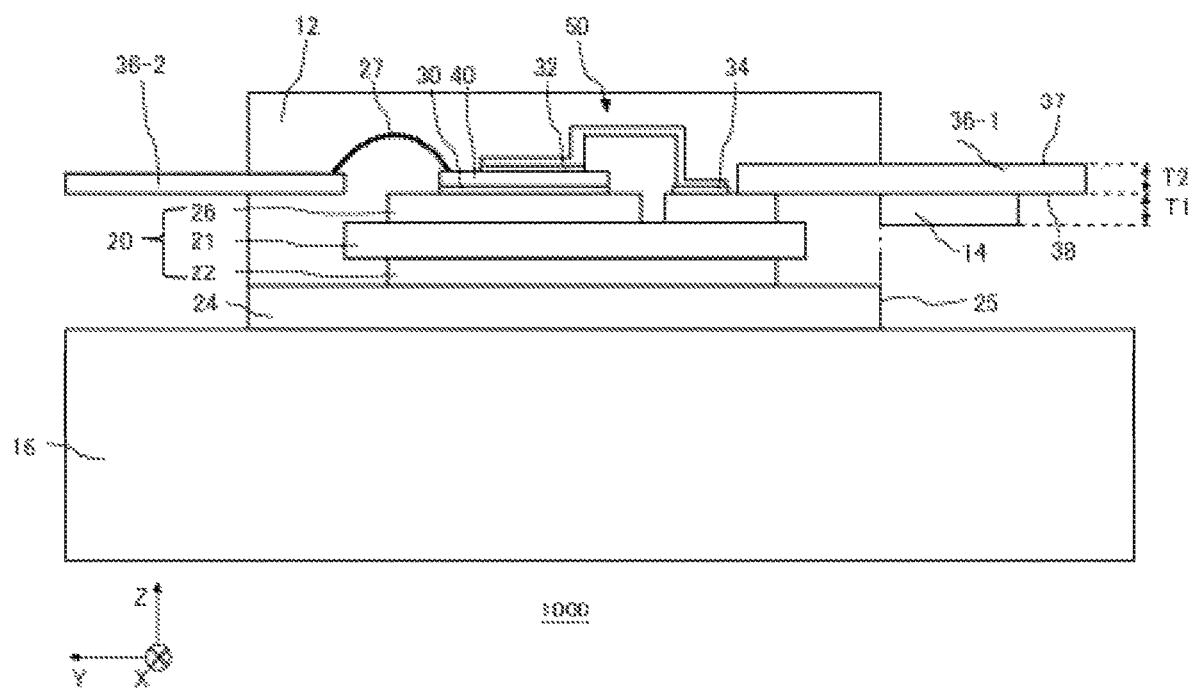
FIG. 12 illustrates one example of a semiconductor module 1000 according to one embodiment of the present invention.

FIG. 12 illustrates one example of the semiconductor module 1000 according to one embodiment of the present invention. The semiconductor module 1000 of FIG. 12 is different from the semiconductor module 100 of FIG. 1 in the shape of the lower side resin 14. The other configurations of the semiconductor module 1000 may be the identical to the semiconductor module 100.

In the present example, the thickness T1 in the height direction of the lower side resin 14 may be equal to or less than the thickness T2 in the height direction of the terminal 36-1. In FIG. 12, the thickness T1 in the height direction of the lower side resin 14 may be equal to the thickness T2 in the height direction of the terminal 36-1. By having this configuration of the lower side resin 14, the amount of sealing resin 12 can be reduced, thus lowering the manufacturing cost.

Figure 13:
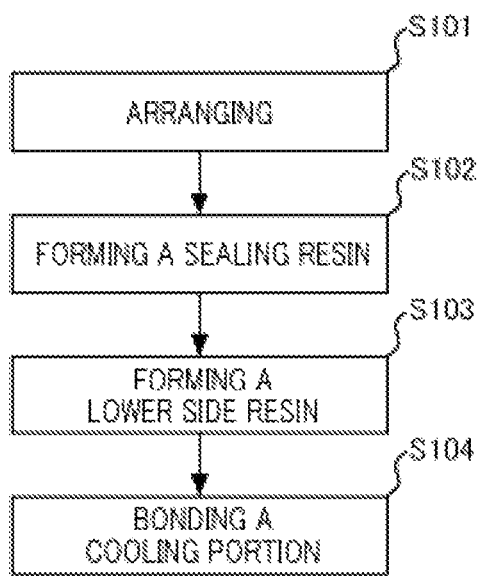
FIG. 13 illustrates one example of a forming method of the semiconductor module 100.

FIG. 13 illustrates one example of the forming method of the semiconductor module 100. The forming method of the semiconductor module 100 includes arranging S101, forming a sealing resin S102, forming a lower side resin S103, and bonding a cooling portion S104.

In the arranging S101, the semiconductor chip 40 and the terminal 36 are arranged. The semiconductor chip 40 and the terminal 36 are arranged inside the mold used in forming the sealing resin S102 and forming the lower side resin S103. In the arranging S101, the terminal 36 may be supported by an external support stage or the like.

In forming the sealing resin S102, the sealing resin 12 is formed so as to cover at least a part of the upper surface 37 of the terminal 36 and at least a part of the lower surface 38 of the terminal 36. In forming the lower side resin S103, the lower side resin 14 is formed so as to cover at least a part of the lower surface 38 of the terminal 36. Forming the sealing resin S102 and forming the lower side resin S103 are performed by transfer molding. That is, the sealing resin 12 and the lower side resin 14 may be formed integrally. In forming the sealing resin S102 and forming the lower side resin S103, the resin is introduced into the mold by flowing in the mold. After the sealing resin 12 and the lower side resin 14 have hardened, the mold is removed.

In bonding the cooling portion S104, the circuit board 20 and the cooling portion 16 are bonded by the bonding portion 24. In the present example, since the lower side resin 14 is formed, deformation of the terminal 36 can be prevented, and an insulation distance between the cooling portion 16 and the terminal 36 can be secured.

Figure 14:
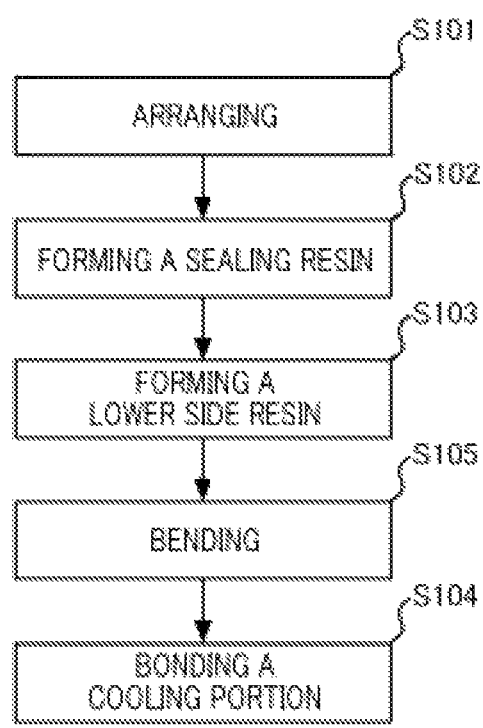
FIG. 14 illustrates one example of a forming method of the semiconductor module 900.

FIG. 14 illustrates one example of the forming method of the semiconductor module 900. The forming method of the semiconductor module 900 of FIG. 14 is different from the forming method of the semiconductor module 100 of FIG. 13 in the point of including bending S105 before bonding the cooling portion S104. The other configurations of the forming method of the semiconductor module 900 may be the identical to the forming method of the semiconductor module 100.

In bending 105, the terminal 36 bends at the bend point 15. The lower side resin 14 may be provided under the bend point 15. Since the terminal 36-1 is supported by the lower side resin 14, the terminal 36-1 tends to bend easilier.

Figure 15:
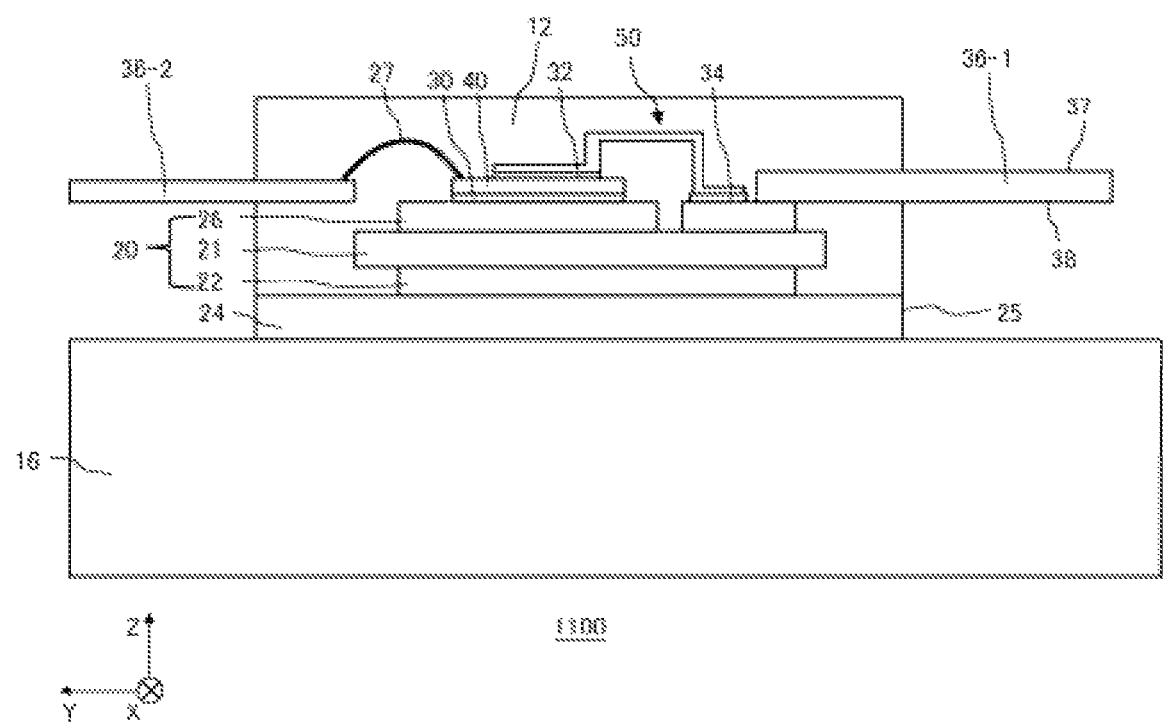
FIG. 15 illustrates one example of a semiconductor module 1100 according to comparative example.

FIG. 15 illustrates one example of the semiconductor module 1100 according to a comparative example The semiconductor module 1100 of FIG. 15 is different from the semiconductor module 100 of FIG. 1 in the point of not including the lower side resin 14. The other configurations of the semiconductor module 1100 may be the identical to the semiconductor module 100.

Figure 16:
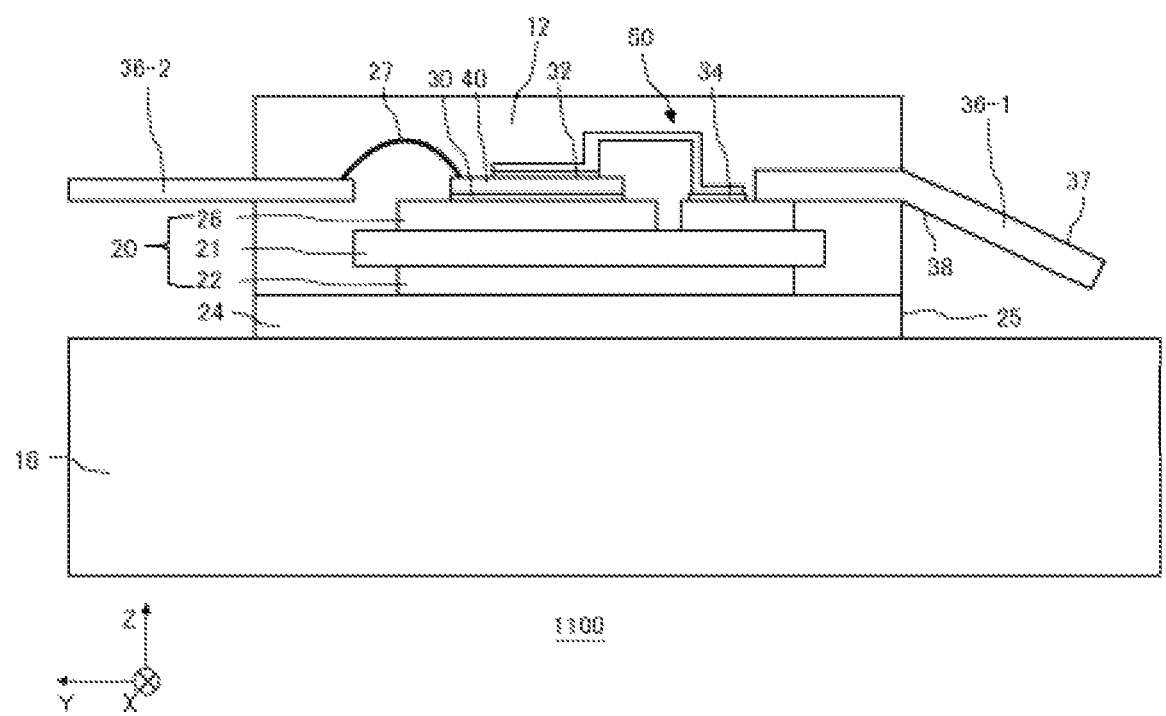
FIG. 16 illustrates a deformation of a terminal 36-1 in the semiconductor module 1100.

FIG. 16 illustrates a deformation of the terminal 36-1 in the semiconductor module 1100. Since the semiconductor module 1100 does not have the lower side resin 14, the terminals 36-1 may deform from the state shown in FIG. 15 as shown in FIG. 16. In this case, the insulation distance can not be secured between the cooling portion 16 and the terminal 36-1. If the insulation distance between the cooling portion 16 and the terminal 36-1 is insufficient, it can cause failure of the semiconductor module 1100.

Figure 17:
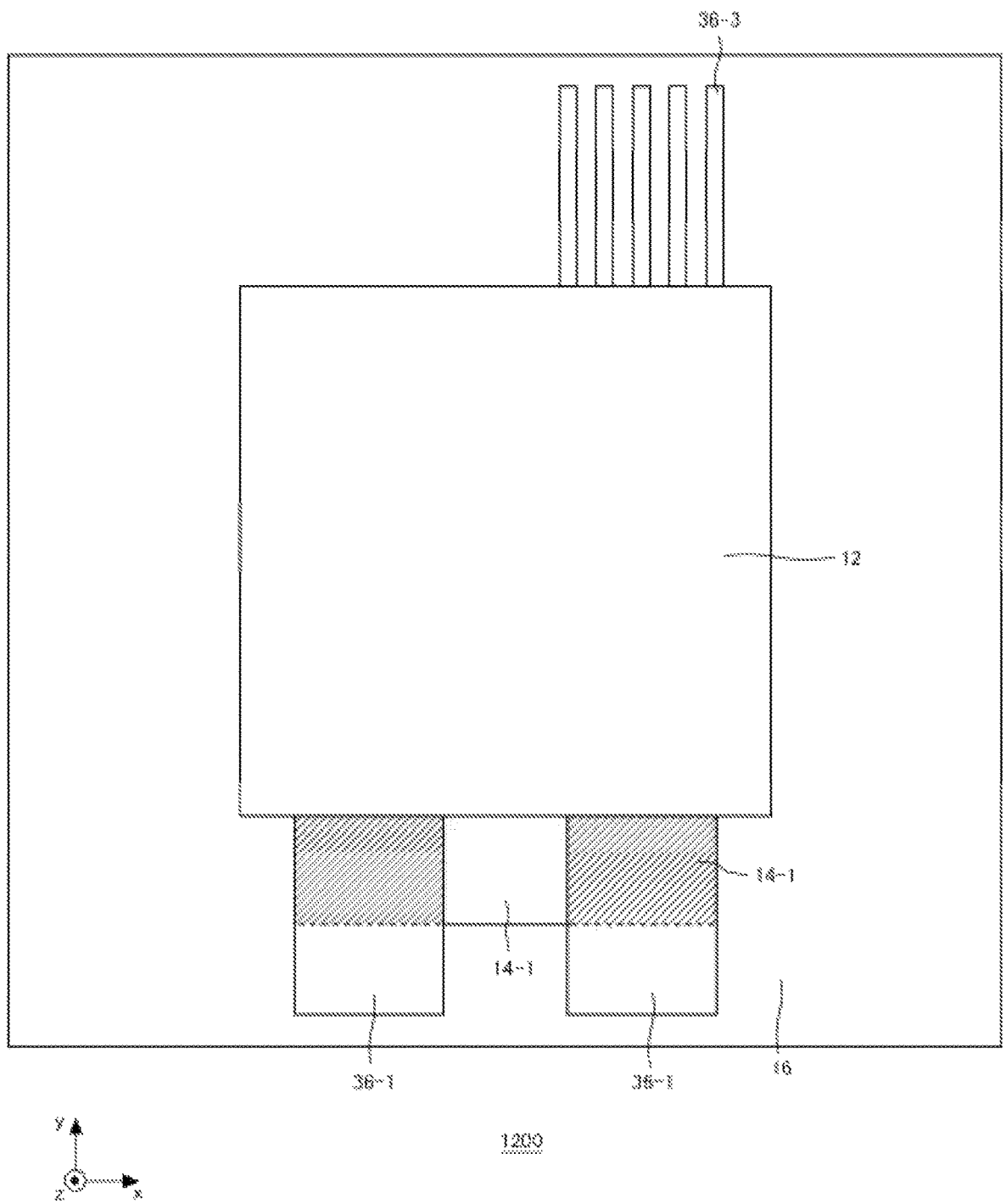
FIG. 17 illustrates one example of a semiconductor module 1200 according to one embodiment of the present invention.

FIG. 17 illustrates one example of the semiconductor module 1200 according to one embodiment of the present invention. In FIG. 17, a top view of the semiconductor module 1200 is shown. In the top view, the semiconductor module 1200 includes a sealing resin 12, a lower side resin 14-1, a cooling portion 16, a plurality of terminals 36-1 and a plurality of terminals 36-3. It should be noted that in FIG. 17, the range where the lower side resin 14 is provided in the plurality of terminals 36-1 is illustrated by hatching.

In the present example, as the terminal 36, the semiconductor module 1200 includes a plurality of terminals 36-1 and a plurality of terminals 36-3. In FIG. 17, the semiconductor module 1200 includes two terminals 36-1. The two terminals 36-1 may extend from one side of the sealing resin 12 in the top view. The two terminals 36-1 may be provided adjacent to each other in the X axis direction. A main current may flow through the two terminals 36-1. The two terminals 36-1 may be connected to the external wires, and output the main current to the outside. The two terminals 36-1 may be a main terminal.

In FIG. 17, the semiconductor module 1200 includes five terminals 36-3. The five terminals 36-3 may extend from one side of the sealing resin 12 in a top view. The five terminals 36-3 may be provided adjacent to each other in the X axis direction. The terminal 36-3 may be a control terminal. That is, each terminal 36-3 may be any one control terminal of a terminal connected to the gate terminal of the semiconductor chip 40, a temperature sensing terminal, a current sensing terminal, a Kelvin Emitter terminal and so on. The terminal 36-3 may have a narrower width in the X axis direction than terminal 36-1.

In the present example, the lower side resin 14-1 is provided on the lower surface 38 of each of the plurality of terminals 36-1. In FIG. 17, the lower side resin 14-1 is provided continuously between the plurality of terminals 36-1 in the top view. The lower side resin 14-1 is provided continuously between the two terminals 36-1 in the top view. In FIG. 17, the lower side resin 14-1 is provided continuously in the X axis direction between the two terminals 36-1 in the top view. One lower side resin 14-1 is provided on the lower surface 38 of the two terminals 36-1. With such a configuration, the insulation distance between the cooling portion 16 and the two terminals 36-1 can be secured. Compared with the case where the lower side resin 14-1 is provided only in a range where the terminal 36-1 is provided, the lower side resin 14-1 can be formed easier.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor module, comprising:
   a semiconductor chip;
   a terminal, configured to extend in an extending direction, and be connected electrically with the semiconductor chip;
   a sealing resin, configured to seal the semiconductor chip, and cover at least a part of an upper surface of the terminal and at least a part of a lower surface of the terminal; and
   a lower side resin, configured to extend in the extending direction from the sealing resin, to cover at least a part of the lower surface of the terminal, and to cover an outer edge of the terminal,
   wherein in the extending direction, a length at which the sealing resin and the lower side resin cover the lower surface of the terminal is greater than a length at which the sealing resin covers the upper surface of the terminal in the extending direction;
   the sealing resin and the lower side resin are formed of a same material; and
   a thickness in a height direction of the lower side resin decreases from the sealing resin as it approaches the outer edge of the terminal.

2. The semiconductor module according to claim 1, wherein
   in the extending direction, at length at which the lower side resin covers the lower surface of the terminal is 30% or more of a length at which the sealing resin does not cover the lower surface of the terminal in the extending direction.

3. The semiconductor module according to claim 1, wherein
   the sealing resin and the lower side resin are formed integrally.

4. The semiconductor module according to claim 1, further comprising:
   a circuit board with a predetermined circuit pattern and the semiconductor chip mounted thereon;
   a cooling portion provided under the circuit board; and
   a bonding portion configured to bond the circuit board and the cooling portion,
   wherein the lower side resin is arranged between the terminal and the cooling portion.

5. The semiconductor module according to claim 4, wherein
   the lower side resin is arranged away from the cooling portion.

6. The semiconductor module according to claim 4, wherein
   the lower side resin is arranged in contact with the cooling portion.

7. The semiconductor module according to claim 6, wherein
   the lower side resin is arranged away from a side surface of the bonding portion.

8. The semiconductor module according to claim 4, wherein the thickness in a height direction of the lower side resin is greater than a thickness in a height direction of the terminal.

9. A semiconductor module, comprising:
a semiconductor chip;
a terminal, configured to extend in an extending direction, and be connected electrically with the semiconductor chip;
a sealing resin, configured to seal the semiconductor chip, and cover at least a part of an upper surface of the terminal and at least a part of a lower surface of the terminal;
a lower side resin, configured to extend in the extending direction from the sealing resin, and cover at least a part of the lower surface of the terminal;
a circuit board with a predetermined circuit pattern and the semiconductor chip mounted thereon;
a cooling portion provided under the circuit board; and
a bonding portion configured to bond the circuit board and the cooling portion,
wherein in the extending direction, a length at which the sealing resin and the lower side resin cover the lower surface of the terminal is greater than a length at which the sealing resin covers the upper surface of the terminal in the extending direction,
the lower side resin is arranged between the terminal and the cooling portion,
the sealing resin and the lower side resin are formed of a same material, and
a thickness in a height direction of the lower side resin is identical to a distance between the terminal and the bonding portion in the height direction, and decreases from the sealing resin as it approaches an edge of the terminal.

10. The semiconductor module according to claim 4, wherein
the thickness in a height direction of the lower side resin is equal to or less than a thickness in a height direction of the terminal.

11. The semiconductor module according to claim 1, comprising a plurality of the terminals,
wherein the lower side resin is provided on a lower surface of each of the plurality of the terminals.

12. The semiconductor module according to claim 11, wherein
the lower side resin is provided continuously between the plurality of the terminals in a top view.

13. The semiconductor module according to claim 1, wherein
the terminal is bonded to the lower side resin.

14. The semiconductor module according to claim 1, wherein
a shape of the lower side resin has a tail along the lower surface of the terminal.

15. The semiconductor module according to claim 1, comprising
a coating resin, configured to extend in the extending direction from the sealing resin, and cover at least a part of the upper surface of the terminal,
wherein a thickness in a height direction of the coating resin is less than a thickness in a height direction of the lower side resin.

16. The semiconductor module according to claim 1, wherein
the terminal is configured to bend at a bend point; and
the lower side resin is provided under the bend point.

17. A manufacturing method of a semiconductor module, comprising:
arranging a semiconductor chip and a terminal configured to extend in an extending direction and be connected electrically;
forming a sealing resin configured to seal the semiconductor chip, and cover at least a part of an upper surface of the terminal and at least a part of a lower surface of the terminal; and
forming a lower side resin configured to extend in the extending direction from the sealing resin, to cover at least a part of the lower surface of the terminal, and to cover an outer edge of the terminal,
wherein in the extending direction, a length at which the sealing resin and the lower side resin cover the lower surface of the terminal is greater than a length at which the sealing resin covers the upper surface of the terminal in the extending direction;
the sealing resin and the lower side resin are formed of a same material; and
a thickness in a height direction of the lower side resin decreases from the sealing resin as it approaches the outer edge of the terminal.

18. The manufacturing method of a semiconductor module according to claim 17, wherein
forming the sealing resin and forming the lower side resin are performed by transfer molding.

19. The manufacturing method of a semiconductor module according to claim 17, further comprising
bending of the terminal, at a bend point,
wherein the lower side resin is provided under the bend point.

20. A manufacturing method of a semiconductor module, comprising:
arranging a semiconductor chip and a terminal configured to extend in an extending direction and be connected electrically;
forming a sealing resin configured to seal the semiconductor chip, and cover at least a part of an upper surface of the terminal and at least a part of a lower surface of the terminal; and
forming a lower side resin configured to extend in the extending direction from the sealing resin, to cover at least a part of the lower surface of the terminal,
wherein in the extending direction, a length at which the sealing resin and the lower side resin cover the lower surface of the terminal is greater than a length at which the sealing resin covers the upper surface of the terminal in the extending direction;
the sealing resin and the lower side resin are formed of a same material; and
a thickness in a height direction of the lower side resin is identical to a distance between the terminal and a bonding portion in a height direction, and decreases from the sealing resin as it approaches an edge of the terminal.

* * * * *